United States Patent [19]
Cheng et al.

[11] Patent Number: 5,350,952
[45] Date of Patent: Sep. 27, 1994

[54] SAMPLE AND HOLD CIRCUIT WITH PUSH-PULL OUTPUT CHARGING CURRENT

[75] Inventors: William W. Cheng, Redondo Beach; Lloyd F. Linder, Agoura Hills, both of Calif.

[73] Assignee: Hughes Aircraft Company, Los Angeles, Calif.

[21] Appl. No.: 909,286

[22] Filed: Jul. 6, 1992

[51] Int. Cl.$^5$ .................. H03K 17/60; G11C 27/02
[52] U.S. Cl. .................. 307/352; 307/355; 307/246
[58] Field of Search .................. 307/352, 353, 523; 328/151

[56] References Cited

U.S. PATENT DOCUMENTS

| | | | |
|---|---|---|---|
| 3,480,800 | 11/1969 | Lynes et al. | 307/352 |
| 4,282,515 | 8/1981 | Patterson, III | 307/352 |
| 4,331,894 | 5/1982 | Gregorian et al. | 307/352 |
| 4,612,464 | 9/1986 | Ishikawa et al. | 307/352 |
| 4,806,790 | 2/1989 | Sone | 307/353 |

Primary Examiner—Timothy P. Callahan
Assistant Examiner—Shawn Riley
Attorney, Agent, or Firm—Georgann S. Grunebach; Terje Gudmestad; W. K. Denson-Low

[57] ABSTRACT

A sample and hold circuit uses a Class AB amplifier architecture rather than a diode bridge in a sampling gate. Input and output transistor pairs (Q5, Q6; Q7, Q8) receive an input voltage (Vin) and provide at an output terminal (6) (a) an output voltage that tracks the input signal, and (b) a current from a load dependent current source (Vcc, Vee). The output current used to charge a sample holding capacitor (Ch) is not limited to the input standing current, and operates with a lower quiescent power consumption and better distortion than prior circuits. Complementary bipolar transistors (Q15, Q16, Q17, Q18; Q9, Q10, Q11, Q12) are used in a clock driver circuit and in the sampling gate to compensate for the different operating speeds of the npn and pnp transistors.

18 Claims, 3 Drawing Sheets

SAMPLE AND HOLD CIRCUIT WITH PUSH-PULL OUTPUT CHARGING CURRENT

This invention was made with Government support under Contract No. DASG60-85-0116 awarded by Department of the Army. The Government has certain rights in this invention.

BACKGROUND OF THE INVENTION

1. Field of the Invention

This invention relates to sample and hold circuits, and more particularly to sample and hold circuits in which a bridge circuit interfaces between the input and output terminals so that the output voltage tracks that at the input.

2. Description of the Related Art

Sample and hold circuits are used to track an input analog signal, and then hold a sampled value of the signal when a sample command is applied. The circuit is typically cycled between track and hold modes, with successive samples normally taken at a rate at least equal to the Nyquist frequency.

A prior sample and hold circuit is illustrated in FIG. 1. It includes a diode bridge circuit 2, with an analog input signal Vin applied to one side of the bridge through an input buffer amplifier A1, and an output signal Vo taken from the opposite side of the bridge through an output resistor Rh. The circuit is configured so that Vo tracks Vin and charges an output holding capacitor Ch at the output terminal.

The alternation between track and hold modes is controlled by a differential pair of bipolar transistors Q1 and Q2, with a hold control signal Vh applied to the base of Q1 and a sample signal Vs applied to the base of Q2. The collectors of Q1 and Q2 (in the npn configuration illustrated) are respectively connected to a current input node N1 and a current output node N2 of the bridge 2, while their emitters are differentially connected to a bias current source I1 that draws a bias current Ib through the differential pair. A second current source I2 provides a current equal to Ib/2 to the bridge's input current node N1, while a third current source I3 provides an equal value of current Ib/2 to the bridge's output current node N2. I2 and I3 are connected to a positive voltage supply bus Vcc, while I1 is connected to a negative voltage bus Vee. A current diversion circuit, consisting of series-connected diodes D1 and D2, conducts current from N2 to N1 during a hold mode to bypass the bridge circuit. A bootstrap amplifier A2 is connected between the output terminal Vo and the connection between D1 and D2, forcing a replication of the output voltage at the D1/D2 interconnection.

During the track mode, Vs is applied to Q2 so that Q2 conducts and Q1 is inactive. The current from I2 thus divides between the input and output branches of the bridge circuit 2 and flows out of the bridge at node N2, where it combines with the current from I3. The combined Ib/2 currents from I2 and I3 then flow through Q2 to provide the Ib current drawn by I1. The activation of the bridge circuit causes the output voltage at Vo to track the input voltage Vin, with transient changes in the input voltage causing transient currents to flow into or out of the holding capacitor Ch to maintain the voltage tracking.

When Vs is replaced by a hold signal Vh applied to Q1, Q2 is cut off and current no longer flows through the diode bridge. The current from I2 instead flows into I1 through Q1, while the current from I3 flows into Q1 through the D1/D2 diversion circuit. Since current flows through D1 and D2 in the direction from N2 to N1, which is opposite to the direction of current flow through the diode bridge 2, the forward voltage drops across D1 and D2 reverse bias the bridge diodes; D1 and D2 can each be implemented by two or more series connected diodes to generate a sufficient voltage drop to reverse bias the bridge diodes.

The diode bridge D2 of FIG. 1 does not provide current gain or reverse isolation, so the buffer amplifier A1 is required to achieve wide bandwidth sampling. Significant amounts of bias current must be used to achieve low distortion operation, and the I3 current that bypasses the bridge during the track mode is simply wasted.

FIG. 2 shows a modification of FIG. 1, with elements common to both figures identified by the same reference numerals, in which the full bias current flows through the diode bridge during the track mode. Instead of the two current sources I2 and I3, each of which supply half the bias current, a single current source I4 is provided with a full bias current value. I4 is connected to both node N1 through the emitter-collector circuit of a pnp bipolar transistor Q3, and to node N2 through the emitter-collector circuit of a second pnp bipolar transistor Q4. An inverted value of the sample control signal Vs is delivered to the base of Q3 through an invertor INV1, while an inverted value of the hold control signal Vh is delivered to the base of Q4 through a second invertor INV2. In the track mode Q2 and Q3 are active, Q1 and Q4 are cut off, and the bias current flows through the diode bridge 2 so that the voltage at Vo tracks the input voltage Vin. During the hold mode Q1 and Q4 are active, Q2 and Q3 are cut off, and the bias current from I4 flows in succession through Q4, D1, D2 and Q1 into current source I1, bypassing the diode bridge so that the output terminal holds the value of the output voltage at the moment the hold mode was entered.

While the circuit of FIG. 2 has less power wastage than FIG. 1, the current available to charge or discharge the holding capacitor Ch is still limited to the diode standing current in the bridge 2, and the slew rate of the input signal that the circuit can handle is limited.

SUMMARY OF THE INVENTION

The present invention seeks to provide a new sample and hold circuit that is low distortion, power efficient, wideband and adaptable to monolithic integration for use in monolithic and hybrid sample and hold configurations. A sampling gate with a near unity voltage gain but greater than unity current gain is also sought.

In accordance with the invention, a Class A-B amplifier configuration is used instead of a diode bridge as the basic sampling mechanism. A pair of input transistors are connected to receive an input voltage signal, while a pair of output transistors are connected to provide to an output terminal (a) an output voltage signal that tracks the input signal, and (b) a current from a load dependent current source to charge/discharge the sample holding capacitor.

The load dependent current is preferably provided from positive and negative voltage busses that are connected to the output terminal through the output transistors, such that a push-pull charging current is provided for the holding capacitor that is not limited to the transistor standing currents. A control circuit is provided to actuate the input and output transistors during a track mode, and to deactuate these transistors during a hold mode. The control circuit includes a pair of bias current sources, a circuit for directing the bias currents through respective input transistors during a track mode, and a circuit for diverting the bias current away from the input transistors during a hold mode. The current diversion circuit includes a pair of diode circuits that reverse bias the input transistors during the hold mode; they include respective buffer transistors that receive a bias voltage and buffer the output terminal from the diode circuits. The control circuit also includes a clock driver circuit with bipolar transistors that are complementary to the transistors used in the sampling gate, and thereby provide for a complementary matching of devices that compensates for the different delays of the npn and pnp devices; aperture errors are also minimized in this fashion.

These and other features and advantages of the invention will be apparent to those skilled in the art from the following detailed description of a preferred embodiment, taken together with the accompanying drawings.

DETAILED DESCRIPTION OF THE INVENTION

Figure 1:
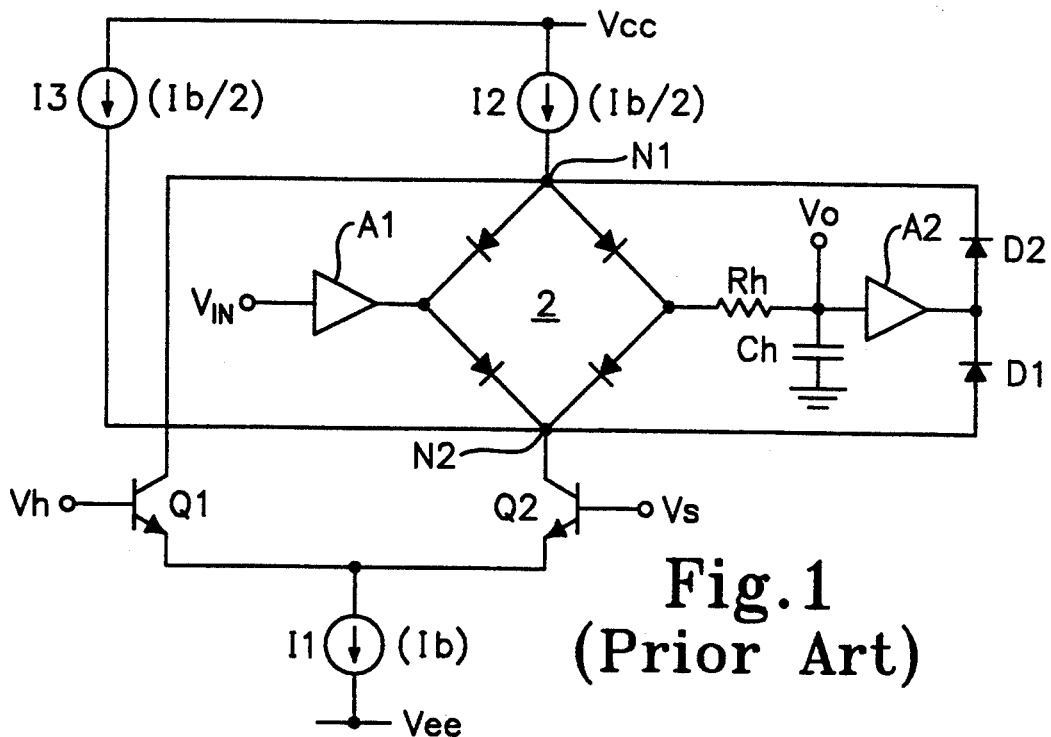
FIGS. 1 and 2 are schematic diagrams of prior sample and hold circuits, described above.
Figure 2:
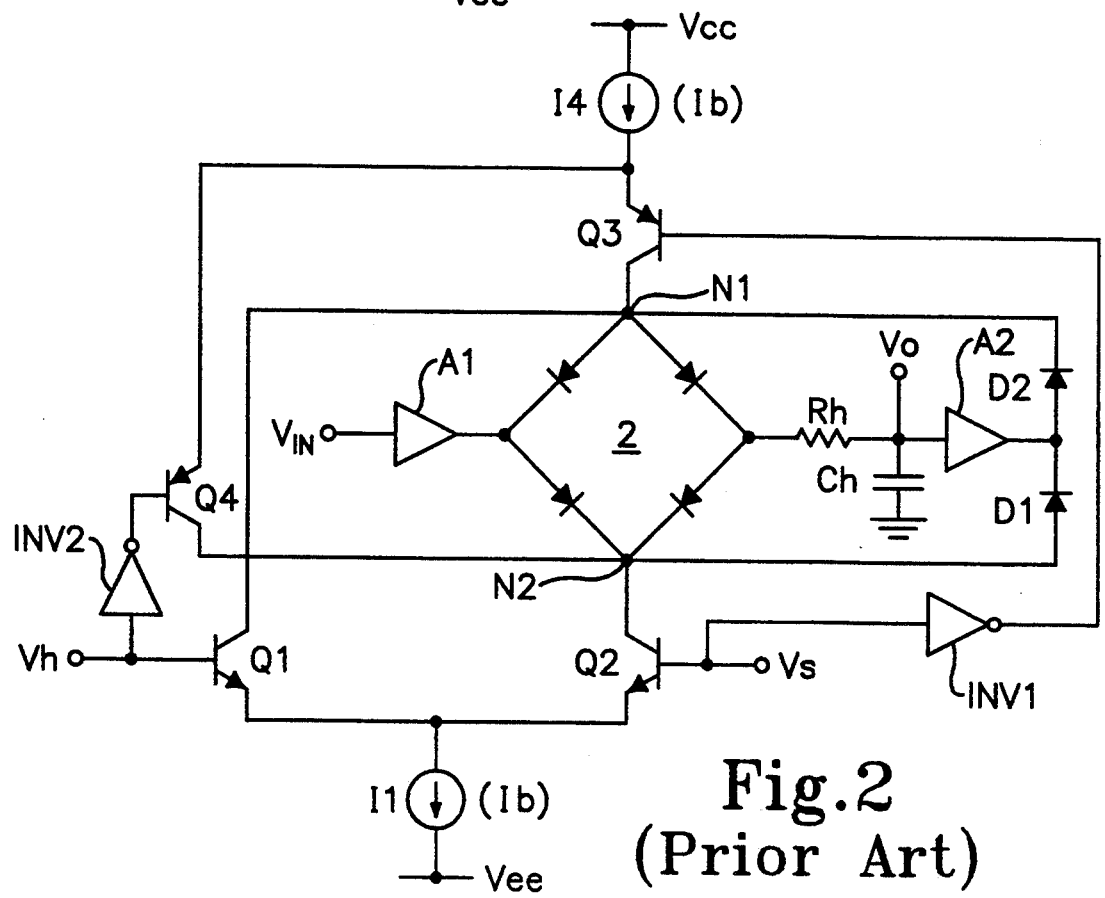
Figure 3:
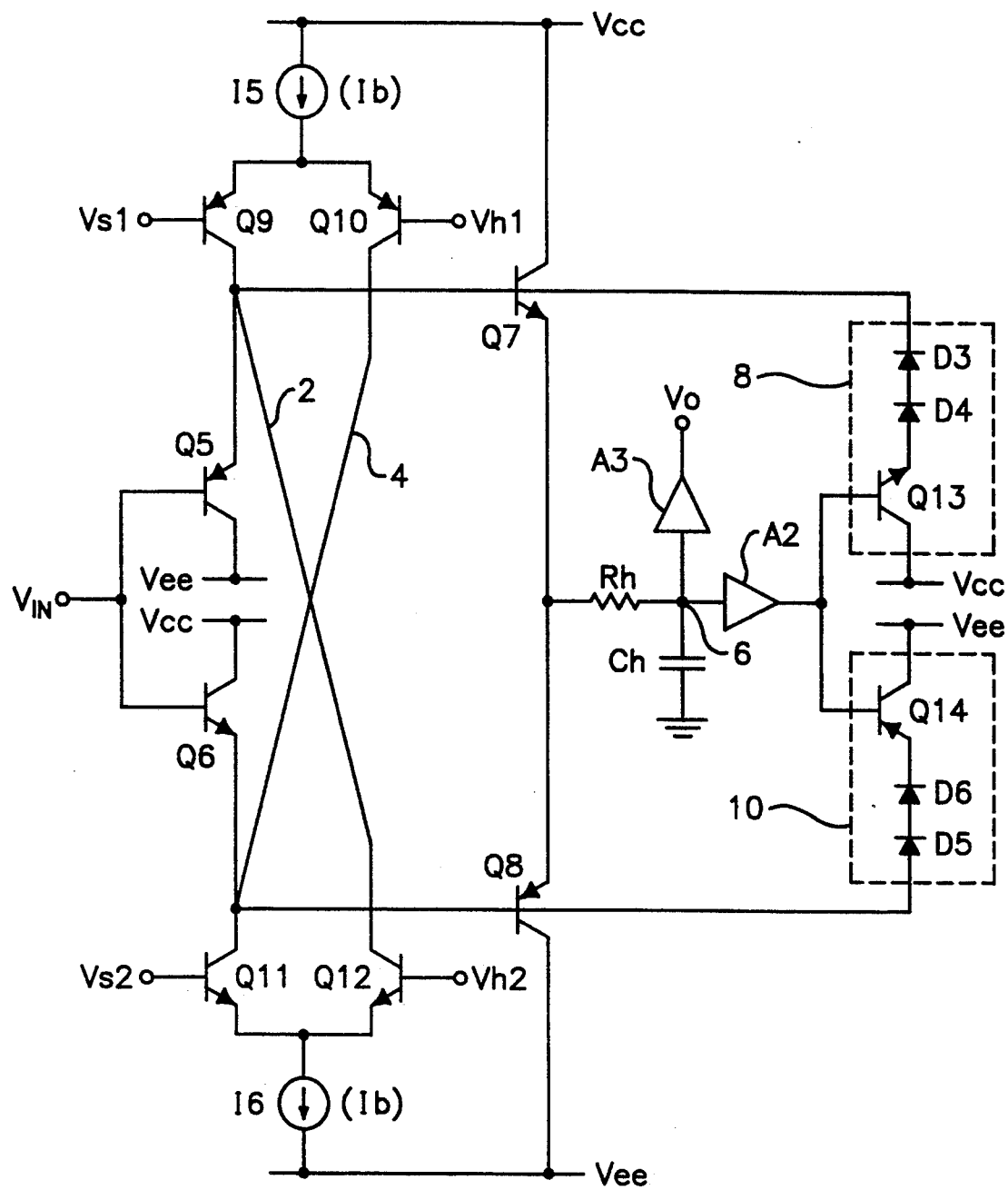
FIG. 3 is a schematic diagram of a sample and hold circuit in accordance with the invention.

A schematic diagram of a preferred embodiment for the new sample and hold circuit is given in FIG. 3. Instead of applying the input voltage Vin to a diode bridge, the input voltage terminal is connected to the bases of complementary bipolar transistors Q5 and Q6, with Q5 implemented as a pnp device and Q6 as an npn device. Note that no buffering amplifier is required at the input to the sampling gate, since the sampling gate itself combines the buffer amplifier function with the sampling function. The collectors of Q5 and Q6 are connected respectively to the negative voltage reference bus Vee and to the positive voltage bus Vcc. Typical voltage supply values are −10v for Vee and +7.5v for Vcc.

Output bipolar transistors Q7 and Q8 are respectively npn and pnp devices that have their bases connected to the emitters of Q5 and Q6 respectively, and their emitters connected to the signal holding circuit that consists of resistor Rh and capacitor Ch. The collector of Q7 is connected to Vcc, while the collector of Q8 is connected to Vee.

When they are activated, Q7 and Q8 provide a push-pull drive to the signal holding circuitry. The source for the output drive current is the voltage supplies Vcc and Vee; the drive currents are therefore dependent in magnitude upon their respective loadings, without being limited to the standing currents through the input transistors.

The input transistor bias current during the sample mode is provided by current sources I5 and I6, which provide equal bias currents (typically 1–2 mA) to input transistors Q5 and Q6, respectively. The circuitry described thus far is comparable to a conventional Class AB amplifier. However, the integration of this type of circuitry into a non-conventional sample and hold application as described herein yields unique advantages for the sample and hold circuit that are not obtainable with prior circuit designs.

To switch the circuitry between track and hold modes, a differential pair of pnp bipolar transistors Q9 and Q10 have their emitters connected to receive current from I5, their collectors connected to the emitters of Q5 and Q6 respectively, and their bases respectively connected to receive a first sample control signal Vs1 and a first hold control signal Vh1. A complementary differential pair consisting of npn transistors Q11 and Q12 have their emitters connected to current source I6, their collectors connected to the emitters of Q6 and Q5 respectively, and their bases respectively connected to receive a second sample control signal Vs2 and a second hold control signal Vh2. The collectors of Q9 and Q10 are also cross-coupled with the collectors of Q11 and Q12, respectively, by leads 2 and 4.

Continuing with the description of the circuitry, the signal at the output terminal 6 between Ph and Ch may be amplified if desired by an output amplifier A3 to produce the ultimate output signal Vo. The output signal at terminal 6 is also processed through a bootstrap amplifier A2 and connected through a pair of diode circuits 8 and 10 back to the emitters of input transistors Q5 and Q6, respectively. Unlike prior diode feedback circuits, the circuits 8 and 10 respectively include bipolar transistors Q13 and Q14 to buffer the output of the sample and hold circuit from the remainder of the diode circuits. A replicated value of the output voltage at terminal 6 is furnished by the bootstrap amplifier A2 to the bases of npn device Q13 and pnp device Q14, the collectors of which are respectively connected to Vcc and Vee. Each diode circuit includes a sufficient number of diodes in series with the emitters of their buffering transistors to reverse-bias the input and output transistors Q5–Q8 during the hold mode, when active currents are flowing through the diode circuits. Diode circuit 8 is illustrated as having a pair of series connected diodes D3 and D4 for this purpose, while diode circuit 10 is illustrated as having a pair of series connected diodes D5 and D6.

To understand how the input transistor Q5 is reverse-biased during hold, recall that the signal applied to the base of Q13 in diode circuit 8 is equal to the input voltage Vin at the time the circuit switches from sample to hold, and assume that the range of the input voltage swing is ±1 volt peak-to-peak. Thus, the highest held voltage that can be applied to the base of Q13 is +1 volt. If no diodes were included in circuit 8, the base-emitter voltage drop of about 0.7 volts for Q13 would therefore set the voltage at the emitter of Q5 at +0.3 V. During subsequent negative excursions of Vin during the hold mode, the base of Q5 could be driven sufficiently below the +0.3 V emitter voltage to turn the pnp transistor on. However, the provision of D3 and D4 in the diode circuit 8 adds an additional forward-bias voltage drop of about 0.7 V for each device, so that even with a maximum held voltage of +1.0 V the voltage at the emitter of Q5 would be about −1.1 V; at this level Q5 could not be turned on during subsequent excursions of Vin within its ±1 V range. Diode circuit 8 also establishes a −2.1 V base-emitter voltage differential across output transistor Q7 to keep that npn device off during the hold mode. In a similar fashion, the diode circuit 10 reverse biases input transistor Q6 and output transistor Q8 during hold.

In operation, to initiate a tracking mode the sample control signals Vs1 and Vs2 respectively go low and high, while the hold control signals Vh1 and Vh2 respectively go high and low. This causes transistors Q9 and Q11 to turn on, and transistors Q10 and Q12 to turn off. The current from source I5 thus flows through Q9 and Q5 into Vee, while the current for source I6 is provided from Vcc through Q6 and Q11. Q5 and Q6 are thus active and function as emitter followers, allowing the output terminal 6 to track the input voltage Vin. Current flows through output transistors Q7 and Q8 in a push-pull fashion to charge or discharge holding capacitor Ch as necessary so that the held signal tracks the input signal Vin. Since the currents through Q7 and Q8 are provided from voltage busses Vcc and Vee, the charging and discharging of Ch is not limited to the standing currents through the input transistors; the sample and hold circuit is thus able to respond to large scale transients in the input signal more effectively than prior circuits.

During the hold mode, the controls signals applied to the bases of Q9–Q12 are reversed so that Q10 and Q12 turn on while Q9 and Q11 turn off. The current from I5 thus flows in succession through Q10, diode circuit 10 to Vee, from Vcc through diode circuit 8 and out through Q12 to furnish the I6 supply current.

The standing currents in input transistors Q5 and Q6 during the track mode may be amplified in the output stage by scaling the area of output transistors Q7 and Q8 greater than the areas of Q5 and Q6; the architecture thus becomes that of a current amplifier. Transistor scalings in the range up to 5:1 would be typical. In addition, the push-pull action of the output stage that can produce transient currents greater than the DC standing current in the input stage provides a low distortion drive capability for the hold capacitor Ch, while maintaining low quiescent power dissipation.

Figure 4:
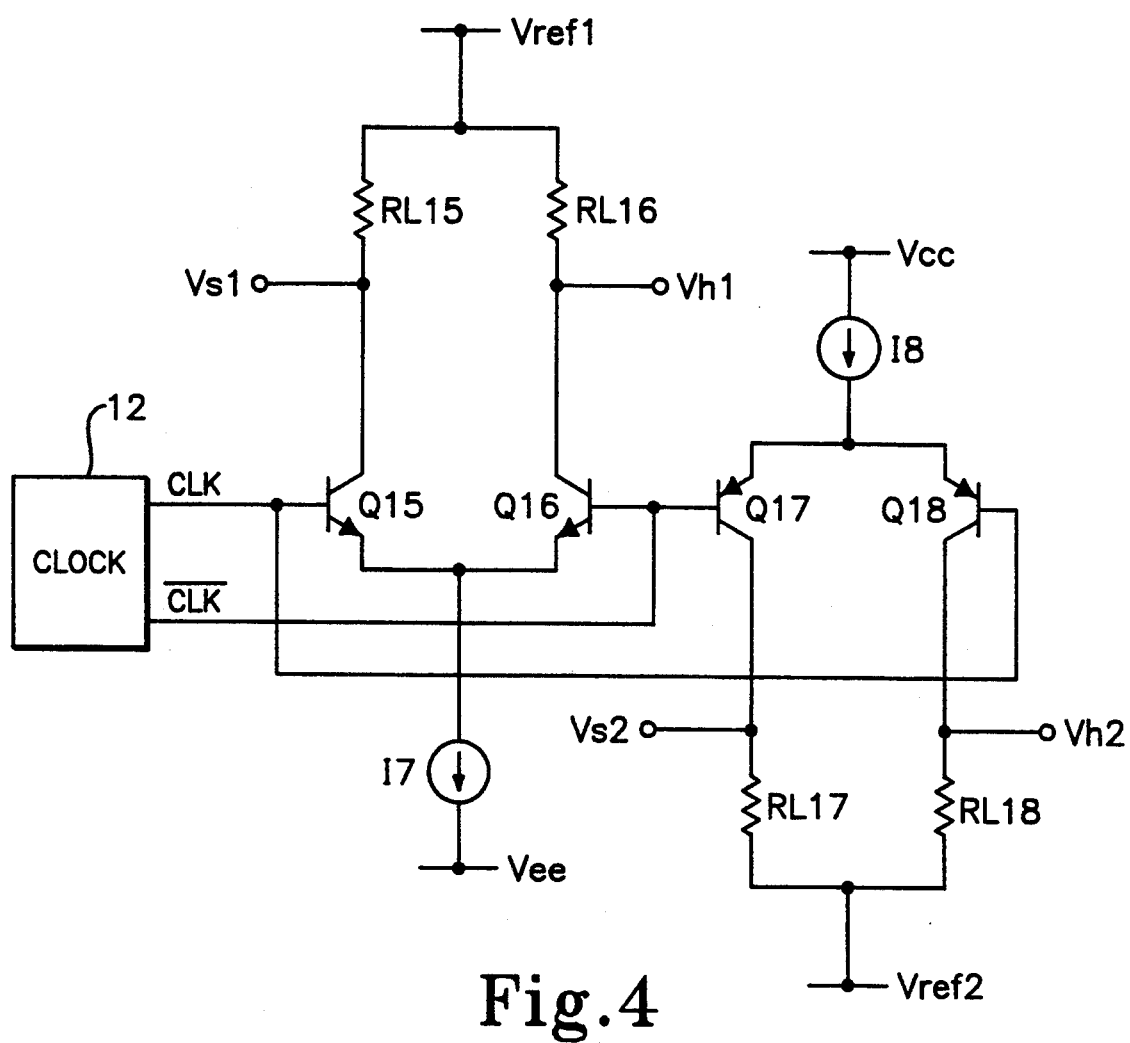
FIG. 4 is a schematic diagram of a clock driver circuit for use with the sample and hold circuit of FIG. 3.

A preferred clock driver circuit that provides the control signals Vs1, Vs2, Vh1 and Vh2 is shown in FIG. 4. The circuit includes a first differential pair formed by npn transistors Q15 and Q16 that have their emitters connected in common to a current source I7 that supplies a bias current to the voltage bus Vee, their collectors connected through respective load resistors RL15 and RL16 to a positive voltage reference Vref1, and their bases respectively provided with complementary clock (CLK) and $\overline{CLK}$ signals from a clock signal generator 12. The control outputs Vs1 and Vh1 are taken respectively from the collectors of Q15 and Q16.

A second differential circuit that is complementary to the circuit just described provides the control signals Vs2 and Vh2. This circuit consists of a differential pair of pnp bipolar transistors Q17 and Q18 that have their emitters connected in common to receive a bias current from a current source I8 that is connected to Vcc, their collectors connected to a negative voltage reference Vref2 through respective load resistors RL17 and RL18, and their bases respectively receiving $\overline{CLK}$ and CLK signals; the Vs2 and Vh2 control outputs are taken from the collectors of Q17 and Q18, respectively. The output of clock 12 alternates between CLK and $\overline{CLK}$ to initiate track and hold modes during each full cycle.

The voltage swings of the differential pairs Q15, Q16 and Q17, Q18 are determined by the magnitude of the bias currents from I7 and I8, and the resistance values of RL15–RL18. The reference voltages Vref1 and Vref2 generate the DC, or fully balanced, level for each control signal that is supplied to the sampling gate; typical values are +5 V for Vref1 and −5 V for Vref2.

The preferred sampling gate shown in FIG. 3 employs both npn and pnp bipolar transistors. Since npn devices are typically faster operation than pnp devices, this can lead to an imbalance in the circuit operating and a resulting distortion in the output signal. This potential imbalance is compensated by having an npn pair of transistors Q15, Q16 in the clock circuit drive the pnp transistors Q9 and Q10 in the sample and hold circuit, and a pair of pnp transistors Q17, Q18 drive a pair of npn transistors Q11, Q12. In this manner the complementary nature of the transistors allows for equal delays and minimizes aperture errors. The output of the clock driver used for driving the sampling gate is typically a low level differential voltage swing, on the order of 0.4 V.

The described sample and hold circuit has been found to require a significantly lower amount of quiescent power than the prior circuits, while achieving a better distortion performance. The DC linearity for a ±1 V input voltage swing was tested to be 16 bits, while the track mode distortion was measured at the 14 bit level at 25 MHz for a load capacitance of 20 pF. To achieve the same performance, the prior circuits would have had to use a substantially greater value of standing current.

While a particular embodiment of the invention has been shown and described, numerous variations and alternate embodiments will occur to those skilled in the art. Accordingly, it is intended that the invention be limited only in terms of the appended claims.

We claim:

1. A class AB sample and hold circuit comprising:
   a load dependent current source,
   an input terminal,
   an output terminal,
   a sample gate comprising a pair of complementary bipolar input transistors that are characterized by respective standing currents and are connected to receive an input voltage signal at said input terminal, and a pair of complementary bipolar output transistors connected to provide to said output terminal (a) an output voltage signal which tracks said input signals, and (b) a current from said load dependent current source that is not limited to said input transistor standing currents, and
   a control circuit that actuates said input and output transistors during a track mode and deactuates said input and output transistors during a hold mode, said control circuit including a pair of bias current sources, a first pair of complementary bipolar transistors for directing the bias current source currents through respective input transistors during a track mode, a second pair of complementary bipolar transistors for diverting said bias current source currents away from said input transistors during a hold mode, and a pair of complementary emitter-follower diode circuits connected to be driven by a signal held at said output terminal substantially independent of the input signal to complete respective circuit paths for said diverted currents during a hold mode.

2. A sample and hold circuit comprising:
   a load dependent current source,
   an input terminal,
   an output terminal,
   a sampling gate comprising a pair of input transistors connected to receive an input voltage signal at said input terminal and a pair of output transistors connected to provide to said output terminal (a) an output voltage signal which tracks said input signal, and (b) a current from said load dependent current source, and a control circuit that actuates said input and output transistors during a track mode and deactuates said input and output transistors during a hold mode, said control circuit including a pair of bias current sources, means for directing the bias current source currents through respective input transistors during a track mode, means for diverting said bias current source currents away from said input transistors during a hold mode, a pair of diode circuits connected to said sampling gate to complete respective circuit paths for said diverted currents during a hold mode, and a bootstrap circuit interconnecting said output terminal with said diode circuits to provide a diode circuit bias voltage that tracks the sampling gate output voltage, said diode circuits being configured to reverse bias said input transistors during a hold mode in response to said bias voltage.

3. The sample and hold circuit of claim 2, said diode circuit including respective buffer transistors to receive said bias voltage and buffer said output terminal from said diode circuits.

4. The sample and hold circuit of claim 1, said control circuit comprising first and second bias current sources, first and second pairs of differentially connected transistors, the first transistors of said first and second differential pairs being of opposite conductivity type to each other and connected to complete current paths for respective input transistors and bias current sources, the second transistors of said first and second differential pairs being of opposite conductivity type to each other and connected to divert said bias current source currents away from said input transistors, and a driver circuit connected to actuate the first transistors of said differential pairs during a track mode and the second transistors of said differential pairs during a hold mode.

5. A sample and hold circuit, comprising:
a load dependent current source,
an input terminal,
an output terminal,
a sampling gate comprising a pair of input transistors connected to receive an input voltage signal at said input terminal and a pair of output transistors connected to provide to said output terminal (a) an output voltage signal which tracks said input signal, and (b) a current from said load dependent current source, and
a control circuit that actuates said input and output transistors during a track mode and deactuates said input and output transistors during a hold mode, said control circuit comprising first and second bias current sources, first and second pairs of differentially connected transistors, the first transistors of said first and second differential pairs connected to complete current paths for respective input transistors and bias current sources, the second transistors of said first and second differential pairs connected to divert said bias current source currents away from said input transistors, and a driver circuit connected to actuate the first transistors of said differential pairs during a track mode and the second transistors of said differential pairs during a hold mode, said driver circuit comprising third and fourth pairs of differentially connected transistors connected to provide alternating actuating signals for the transistors of said first and second differential pairs, respectively, in response to input clock signals, the transistors of said first, second, third and fourth differential pairs comprising common-type bipolar transistors within each pair of type-npn or type-pnp, the transistors of said first differential pair being of opposite type to the transistors of said third differential pair, and the transistors of said second differential pair being of opposite type to the transistors of said fourth differential pair.

6. The sample and hold circuit of claim 1, further comprising a signal holding means connected to said output terminal to hold the output terminal voltage during a hold mode.

7. The sample and hold circuit of claim 1, said load dependent current source comprising voltage buses of opposite polarity connected in circuit with said output terminal through respective ones of said output transistors.

8. A sample and hold circuit for applying output signals to an output terminal to which a signal holding means can be connected, comprising:
positive and negative voltage buses,
an input terminal,
an output terminal,
first and second bias current sources respectively receiving current from said positive voltage bus and delivering current to said negative voltage bus,
a pnp input transistor having its base connected to said input terminal, its emitter connected to receive current from said first bias current source, and its collector connected to a negative voltage bus,
an npn input transistor having its base connected to said input terminal, its emitter connected to deliver current to said second bias current source, and it collector connected to a positive voltage bus,
an npn output transistor having its base connected to the emitter of said pnp input transistor, its emitter connected to said output terminal and its collector connected to receive a current to supply to said output terminal during a track mode,
a pnp output transistor having its base connected to the emitter of said npn input transistor, its emitter connected to said output terminal and its collector connected to transmit a current received from said output terminal during a track mode, and
a control circuit connected to divert current from said bias current sources away from said input transistors during a hold mode.

9. The sample and hold circuit of claim 8, wherein the collectors of said npn and pnp output transistors are connected respectively to positive and negative voltage buses.

10. The sample and hold circuit of claim 9, wherein said output transistors are scaled larger than said input transistors, and thereby provide current amplification with respect to the currents through said input transistors during a track mode.

11. The sample and hold circuit of claim 9, said control circuit including first and second pairs of differentially connected transistors, a pair of current diversion circuits, and a driver circuit connected to actuate the first transistors of said differential pairs during a track mode and the second transistors of said differential pairs during a hold mode, the first transistors of said first and second differential pairs connected to complete respective current paths for said first and second bias current sources and for said pnp and npn input transistors, and the second transistors of said first and second differential pairs connected to complete respective current paths for said first and second bias current sources and for respective current diversion circuits.

12. The sample and hold circuit of claim 11, said driver circuit comprising third and fourth pairs of differentially connected transistors connected to provide alternating actuating signals for the transistors of said first and second differential pairs, respectively, in response to input clock signals, the transistors of said first, second, third and fourth differential pairs comprising common-type bipolar transistors within each pair of type-npn or type-pnp, the transistors of said first differential pair being of opposite type to the transistors of said third differential pair, and the transistors of said second differential pair being of opposite type to the transistors of said fourth differential pair.

13. The sample and hold circuit of claim 11, said current diversion circuits comprising a first diversion transistor connected in series with at least one respective diode to transmit current from a positive voltage bus to the second transistor of said second differential pair when the latter transistor is actuated, and a second diversion transistor connected in series with at least one respective diode to transmit current from the second transistor of said first differential pair to a negative voltage bus when the latter transistor is actuated.

14. The sample and hold circuit of claim 13, said first and second diversion transistors comprising bipolar transistors with their collector-emitter circuits connected between their respective voltage buses and their respective diodes, and their bases connected to track the output terminal voltage, said diversion transistors buffering the output terminal from their respective diodes.

15. The sample and hold circuit of claim 8, further comprising a signal holding means connected to said output terminal to hold the output terminal voltage during a hold mode.

16. A balanced control circuit for providing alternating circuit connections in response to alternating control signals, comprising:

a first pair of differentially connected bipolar transistors of a common type that is either type-npn or type-pnp,
a second pair of differentially connected bipolar transistors of a common type that is opposite to that of the first differential pair,
respective output circuits connected to the transistors of said second differential pair for generating an alternating pair of bias signals in response to alternating control signals applied to the transistors of said second differential pair, and
means for applying said bias signals to alternately actuate and deactuate the transistors of said first differential pair.

17. The control circuit of claim 16, for providing alternating push-pull circuit connections in response to said alternating control signals, further comprising a third pair of differentially connected bipolar transistors of a common type that is opposite to said first differential pair, a fourth pair of differentially connected bipolar transistors of a common type that is opposite to said second differential pair, respective output circuits connected to the transistors of said fourth differential pair for generating an alternating pair of bias signals in response to alternating control signals applied to the transistors of said fourth differential pair, the first and second transistors of said first differential pair connected in series respectively with the second and first transistors of said third differential pair, means for applying alternating control signals to the transistors of said fourth differential pair in synchronism with the application of alternating control signals to the transistors of said second differential pair, and means for applying the bias signals from the output circuits for said fourth differential pair to respective transistors of said third differential pair so that the first transistors of said first and third differential pairs are alternately actuated and deactuated in synchronism with each other, and the second transistors of said first and third differential pairs are alternately actuated and deactuated in synchronism with each other and opposite to the actuation and deactuation of said first transistors.

18. The sample and hold circuit of claim 6, said signal holding means comprising a capacitor that is connected to said output terminal through a resistor.

* * * * *